US012701946B2

(12) United States Patent
Jeon et al.

(10) Patent No.: US 12,701,946 B2
(45) Date of Patent: Aug. 4, 2026

(54) BUFFING CLEANING APPARATUS

(71) Applicant: Samsung Electronics Co., Ltd., Suwon-si (KR)

(72) Inventors: Inhak Jeon, Suwon-si (KR); Donghoon Kwon, Suwon-si (KR); Jihoon Park, Suwon-si (KR); Seungyong Yu, Suwon-si (KR); Byungsoo Joo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 36 days.

(21) Appl. No.: 18/893,553

(22) Filed: Sep. 23, 2024

(65) Prior Publication Data

US 2025/0246452 A1     Jul. 31, 2025

(30) Foreign Application Priority Data

Jan. 25, 2024     (KR) ........................ 10-2024-0011413

(51) Int. Cl.
H10P 72/00 (2026.01)
(52) U.S. Cl.
CPC ................................ H10P 72/0406 (2026.01)

(58) Field of Classification Search
CPC .................................................... H10P 72/0406
See application file for complete search history.

(56) References Cited

U.S. PATENT DOCUMENTS

2017/0025269 A1* 1/2017 Ryo ........................ H10P 70/30

FOREIGN PATENT DOCUMENTS

| JP | 2006-305640 | A | 11/2006 |
| JP | 2014-011378 | A | 1/2014 |
| KR | 10-0336798 | B1 | 11/2002 |
| KR | 10-2007-0013792 | A | 1/2007 |
| KR | 10-0880937 | B1 | 2/2009 |
| KR | 10-2229920 | B1 | 3/2021 |
| KR | 10-2022-0116312 | A | 8/2022 |
| WO | 2015-061741 | A1 | 4/2015 |
| WO | 2022-098527 | A1 | 5/2022 |

* cited by examiner

*Primary Examiner* — Jason Y Ko
(74) *Attorney, Agent, or Firm* — Muir Patent Law, PLLC

(57) ABSTRACT

A buffing cleaning apparatus includes chuck table having a vacuum hole, and a film disposed on an upper surface of the chuck table, the film having a communication hole vertically overlapping the vacuum hole. An upper surface of the film is configured to receive a wafer. The film has a drain hole configured to drain liquid through the drain hole. The chuck table has a drain groove vertically overlapping the drain hole.

20 Claims, 14 Drawing Sheets

100

100

BUFFING CLEANING APPARATUS

CROSS-REFERENCE TO RELATED APPLICATION(S)

This application claims benefit of priority to Korean Patent Application No. 10-2024-0011413 filed on Jan. 25, 2024 in the Korean Intellectual Property Office, the disclosure of which is incorporated herein by reference in its entirety.

BACKGROUND

The present inventive concept relates to a buffing cleaning apparatus.

After a CMP process, a cleaning process is typically necessary to remove particles remaining on a substrate (wafer), and such a cleaning process is typically performed using a buffing cleaning apparatus.

A buffing cleaning process may be a process of removing particles using a contact-type cleaning module while rotating a substrate (wafer) in a state in which the substrate (wafer) is fixed using deformation of a backing film having a communication hole disposed to correspond to a vacuum hole formed on a chuck table.

However, when a large amount of deionized water (DIW) remains from a previous process on the backing film, thereby forming a thick water film thereon, or when adhesion between a film of a rear surface of the substrate (wafer) and the backing film is insufficient, the substrate (wafer) may slip when the chuck table rotates.

SUMMARY

An aspect of the present inventive concept provides a buffing cleaning apparatus capable of preventing a substrate (wafer) from slipping on a film by improving/increasing frictional force between a rear surface of the substrate (wafer) and the film.

According to an aspect of the present inventive concept, there is provided a buffing cleaning apparatus including a chuck table having a vacuum hole, and a film disposed on an upper surface of the chuck table, the film having a communication hole vertically overlapping the vacuum hole. A wafer may be mounted on an upper surface of the film. The film may have a drain hole configured to drain liquid through the drain hole. The chuck table may have a drain groove vertically overlapping the drain hole.

According to an aspect of the present inventive concept, there is provided a buffing cleaning apparatus comprises a chuck table having a vacuum hole, a film disposed on an upper surface of the chuck table, the film having a communication hole vertically overlapping the vacuum hole; and a cleaning module disposed to be adjacent to the chuck table to perform cleaning of a wafer, wherein the film is configured such that the wafer is mounted on an upper surface of the film, the film has a drain hole configured such that pure water remaining from a previous process flows through the drain hole, the chuck table has a drain groove vertically overlapping the drain hole, and at least one end of the drain hole is open toward a peripheral surface of the film, and at least one end of the drain groove is open toward a peripheral surface of the chuck table.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments of the present inventive concept will be described with reference to the attached drawings.

Figure 1:
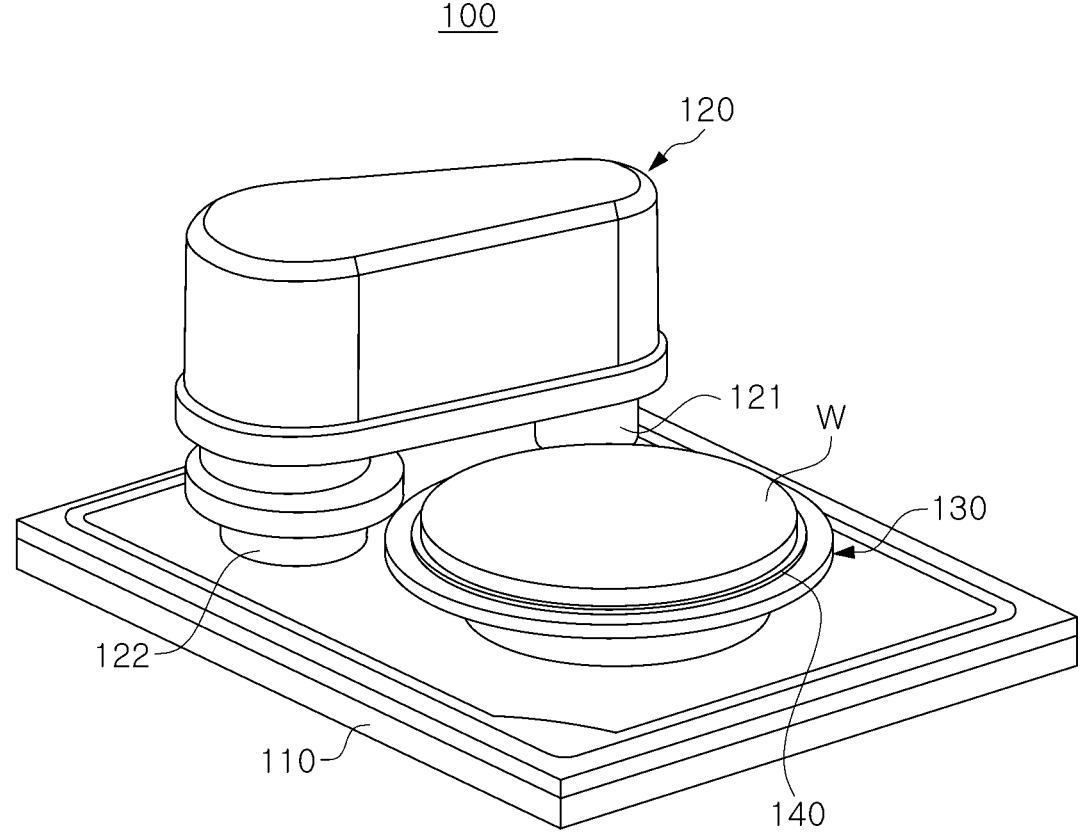
FIG. 1 is a diagram of a buffing cleaning apparatus according to an example embodiment.
Figure 2:
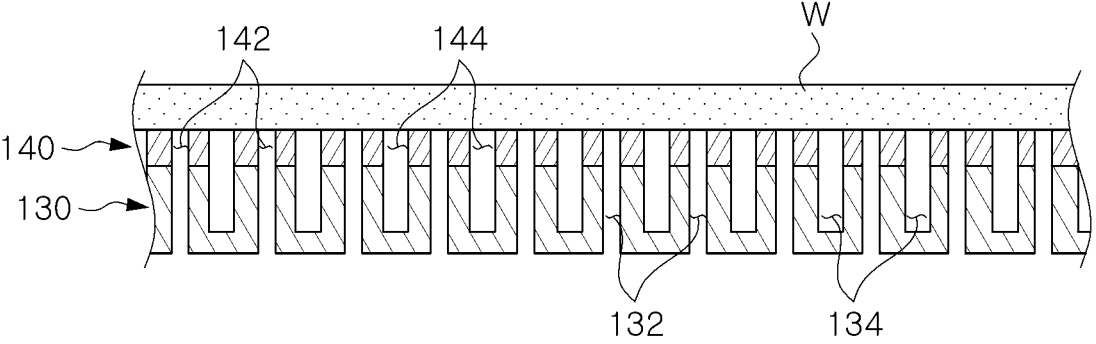
FIG. 2 is a cross-sectional view of a chuck table and a film of a buffing cleaning apparatus according to an example embodiment.
Figure 3:
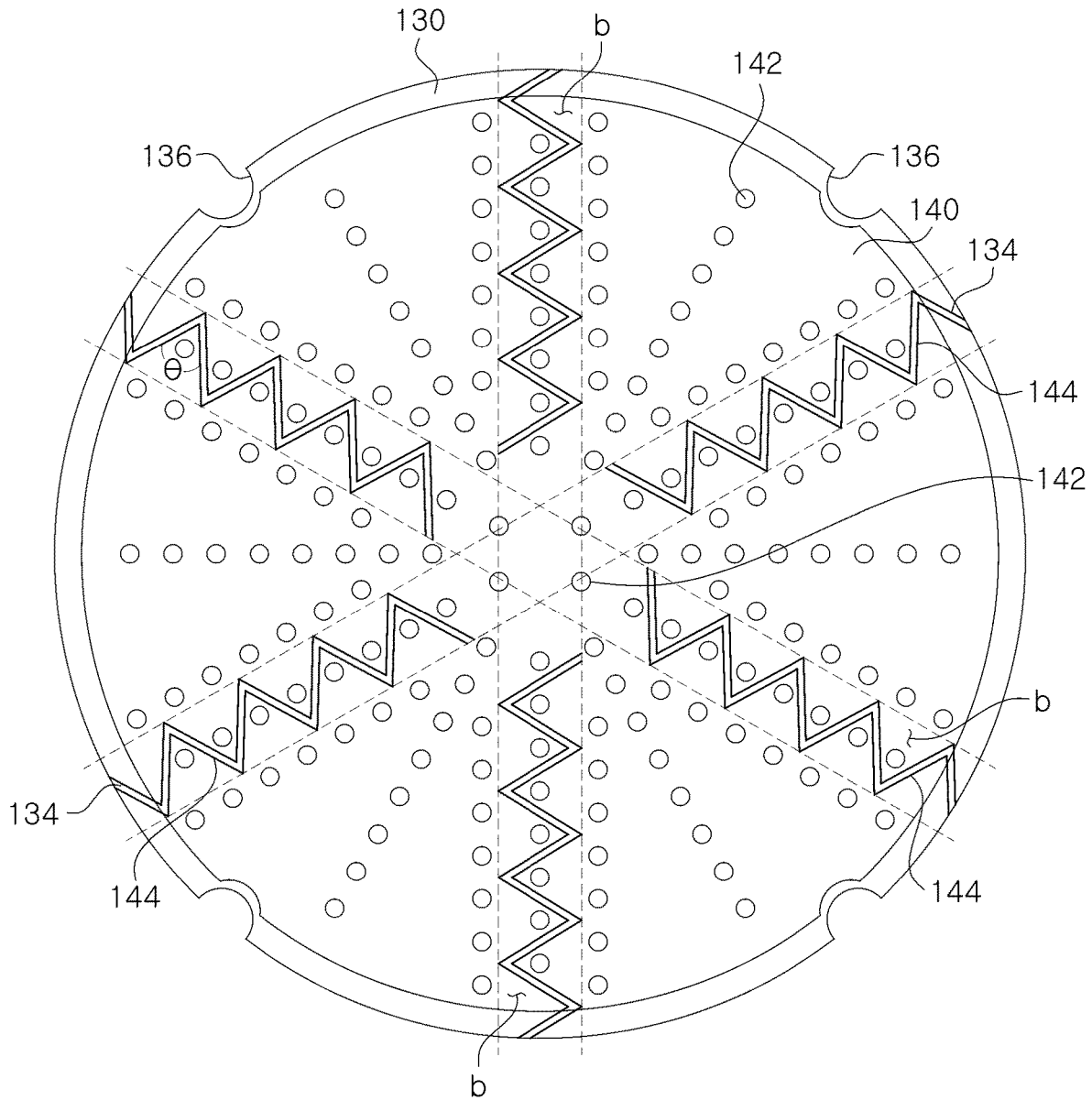
FIG. 3 is a plan view of a chuck table and a film of a buffing cleaning apparatus according to an example embodiment.

FIG. 1 is a diagram of a buffing cleaning apparatus according to an example embodiment. FIG. 2 is a cross-sectional view of a chuck table and a film of a buffing cleaning apparatus according to an example embodiment. FIG. 3 is a plan view of a chuck table and a film of a buffing cleaning apparatus according to an example embodiment.

Referring to FIGS. 1 to 3, a buffing cleaning apparatus 100 according to an example embodiment includes a body 110, a cleaning module 120, a chuck table 130, and a film 140.

The cleaning module 120 and the chuck table 130 may be installed on an upper surface of the body 110. The cleaning module 120 may be disposed on one side of the upper surface of the body 110, and the chuck table 130 may be disposed on the other side of the upper surface of the body.

The cleaning module 120 may be disposed to be adjacent to the chuck table 130, and may perform cleaning of a wafer W (see FIG. 2) adsorbed on the film 140. To this end, the cleaning module 120 may have a cleaning member 122. The cleaning member 122 may be disposed on one side of the cleaning module 120, and a rotational shaft 121 may be disposed on the other side of the cleaning module 120. The cleaning member 122 may rotate around the rotational shaft 121, and may be moved to a cleaning position and/or standby position of the wafer W.

The chuck table 130 may have a vacuum hole 132 providing suction force such that the wafer W is adsorbed on the film 140. For example, the chuck table 130 may hold the wafer W on the chuck table 130 with the film 140 interposed therebetween. A plurality of vacuum holes 132 may be provided in the chuck table 130, and may be evenly distributed over the entire region of the chuck table 130. The chuck table 130 may have a drain groove 134 disposed such that the drain groove 134 does not interfere with the vacuum hole 132. For example, the drain groove 134 may not vertically overlap the plurality of vacuum holes 132. For example, a plurality of drain grooves 134 may be provided in the chuck table 130 such that the plurality of drain grooves 134 do not vertically overlap (e.g., are horizontally spaced apart from) the plurality of vacuum holes 132. The drain groove 134 may serve to accommodate pure water (or cleaning liquid) remaining on the upper surface of the film 140 and then discharge the pure water to an outer peripheral surface of the chuck table 130. For example, the pure water may be deionized water used for cleaning the substrate and/or the film 140 in a previous step of a manufacturing process. To this end, at least one end of the drain groove 134 may be open toward the outer peripheral surface of the chuck table 130. For example, the outer peripheral surface of the chuck table 130 may be a peripheral surface (e.g., a side surface) of the chuck table 130. An installation groove 136 may be provided in an edge of the chuck table 130 to guide a position of the film 140. Four installation grooves 136 may be disposed to be spaced apart from each other in a circumferential direction in the edge of the chuck table 130.

The film 140 may be disposed on the upper surface of the chuck table 130, and may have a communication hole 142 corresponding to (e.g., vertically overlapping) the vacuum hole 132. Accordingly, the wafer W may be adsorbed on the upper surface of the film 140. A plurality of communication holes 142 may be provided in the film 140, and may be evenly distributed over the entire region of the film 140. For example, the communication holes 142 may respectively vertically overlap the vacuum holes 132 such that vacuum force applied to the vacuum holes 132 of the chuck table 130 can be transferred to a substrate (e.g., a wafer) through the communication holes 142 of the film 140 thereby adsorbing the substrate (wafer) onto the upper surface of the film 140. For example, each communication hole 142 may completely vertically overlap a corresponding vacuum hole 132. For example, each communication hole 142 may be congruent to a corresponding vacuum hole 132 in a plan view. The film 140 may have a drain hole 144 connected to the drain groove 134 such that the drain hole 144 does not interfere with the communication hole 142. For example, the plurality of drain grooves 134 may not vertically overlap the plurality of communication holes 142 when the film 140 is disposed on the chuck table 130. As described above, the drain hole 144 may be connected to the drain groove 134, such that pure water, remaining on the upper surface of the film 140, may pass through the drain hole 144 and be accommodated in the drain groove 134. At least one end of the drain hole 144 may also be open toward an outer peripheral surface of the film 140. For example, the outer peripheral surface of the film 140 may be a peripheral surface (e.g., a side surface) of film 140. Accordingly, the pure water, accommodated in the drain hole 144, may be discharged to the outer peripheral surface of the film 140. The pure water may not remain on the upper surface of the film 140, but may be accommodated in the drain groove 134 of the chuck table 130 through the drain hole 144, or may be discharged to the outer peripheral surfaces of the chuck table 130 and the film 140 through the drain hole 144 and the drain groove 134, such that frictional force between the film 140 and the wafer W may increase, thereby preventing the wafer W from slipping. By removing the pure water from between the substrate (wafer W) and the film 140, frictional force between the substrate and the film 140 may increase. This may be also true when another cleaning liquid is removed from between the substrate/wafer W and the film 140 instead of the pure water.

The drain groove 134 provided in the chuck table 130, and the drain hole 144 provided in the film 140 will be described in more detail hereinafter. FIG. 3 illustrates a shape of the drain hole 144 provided in the film 140 when viewed from above (e.g., in a plan view), and a shape of the drain groove 134 of the chuck table 130 may be the same as the shape of the drain hole 144, e.g., in a plan view. Thus, the shape of the drain hole 144 of the film 140 will be described herein.

As illustrated in FIG. 3, the drain hole 144 may have a zigzag shape, when viewed from above (e.g., in a plan view). As an example, one end of the drain hole 144 may be open toward the outer peripheral surface of the film 140, and the other end of the drain hole 144 may be disposed on the outside of a central portion of the film 140 or a central portion of the film 140 (e.g., near a center of the film 140).

For example, only the communication hole 142 may be disposed in the central portion of the film 140, and the drain hole 144 may not be disposed in the central portion of the film 140. A plurality of drain holes 144 having a zigzag shape may be radially disposed, and may be disposed on the inside of a straight virtual band b. For example, the straight virtual band b may be a region of the film 140 having a straight band shape, and each of the drain holes 144 may have a zigzag shape as shown in FIG. 3, and may have vertices at points at which two parts of the zigzag shape extending two different directions meet. The vertices of each drain hole 144 may be arranged on two parallel lines and the straight virtual band b may be formed of the two parallel lines and an area between the two parallel lines. Therefore, each drain hole 144 having a zigzag shape may be disposed within the straight virtual band b. As an example, eight drain holes 144 may be provided. However, the number of drain holes is not limited thereto, and seven drain holes 144 or nine or more drain holes 144 may be provided. When viewed from above (e.g., in a plan view), an angle $\theta$ between a portion of a drain hole 144 extending in one direction and another portion of the drain hole 144 extending in another direction may form an acute angle. For example, the angle $\theta$ may be an angle formed between two parts of the zigzag shape of the drain hole 144 extending different direction from each other and meeting at a vertex of the zigzag shape of the drain hole 144 as shown in FIG. 3.

In addition, the drain hole 144 and the drain groove 134 may have the same shape, and thus the above description of the drain hole 144 may also be applied to the drain groove 134.

The pure water may not remain on the upper surface of the film 140, but may be accommodated in the drain groove 134 of the chuck table 130 through the drain hole 144, or may be discharged to the outer peripheral surfaces of the chuck table 130 and the film 140 through the drain hole 144 and the drain groove 134, such that frictional force between the film 140 and the wafer W may increase, thereby preventing the wafer W from slipping on the film 140.

Figure 4:
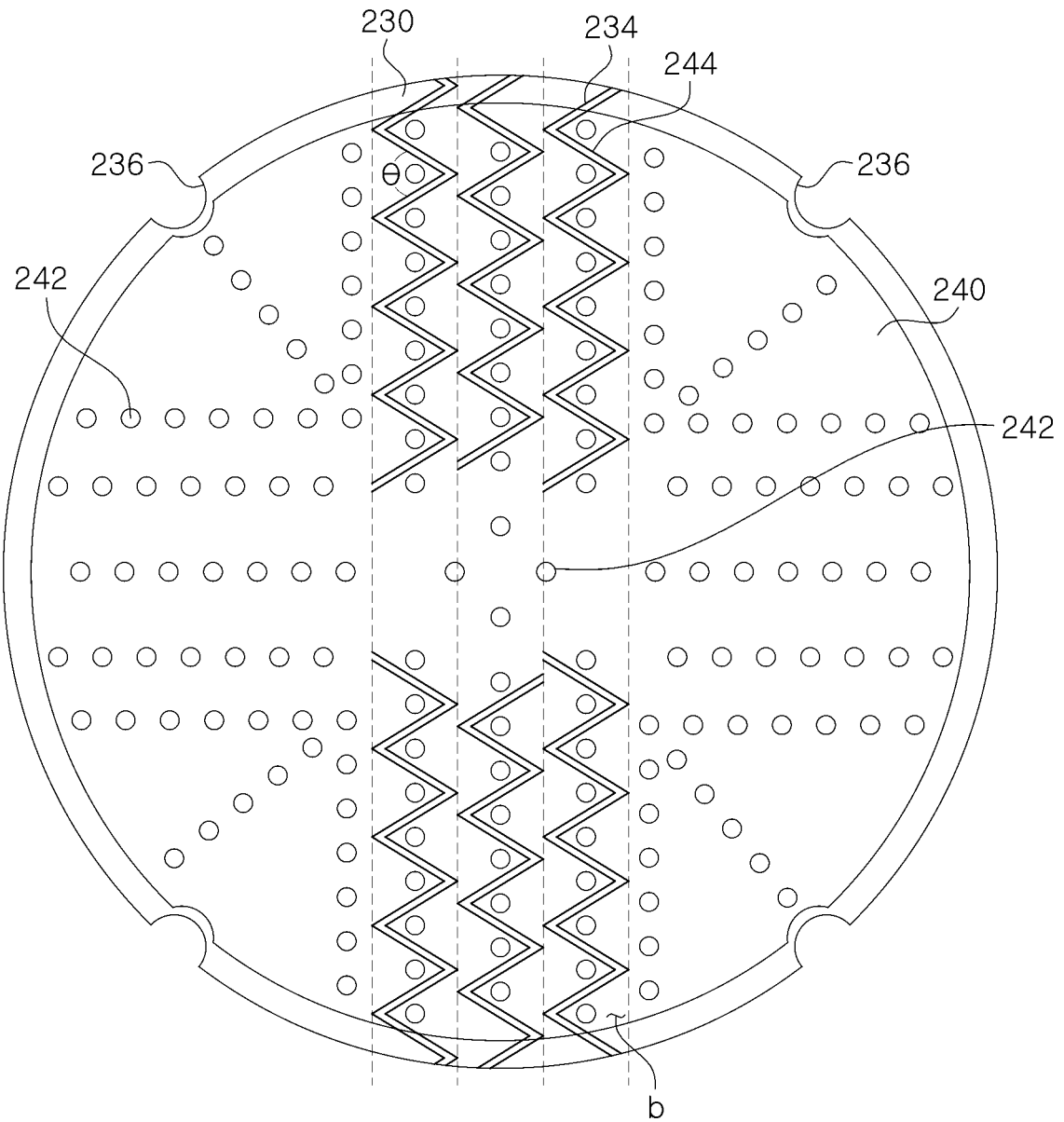
FIGS. 4 to 14 are plan views of chuck tables and films of a buffing cleaning apparatus according to example embodiments.

FIG. 4 is a plan view of a chuck table and a film of a buffing cleaning apparatus according to an example embodiment.

Referring to FIG. 4, a film 240 may be disposed on an upper surface of a chuck table 230, and may have a communication hole 242 corresponding to (e.g., vertically overlapping) a vacuum hole (not illustrated in FIG. 4, but refer to the vacuum hole 132 of FIG. 2) of the chuck table 230. Accordingly, a wafer W (see FIG. 2) may be adsorbed on an upper surface of the film 240. A plurality of communication holes 242 may be provided in the film 240, and may be evenly distributed over the entire region of the film 240. The film 240 may have a drain hole 244 connected to a drain groove 234 of the chuck table 230 such that the drain hole 244 does not interfere with the communication hole 242. For example, the drain hole 244 may be horizontally spaced apart from the plurality of communication holes 242. For example, a plurality of drain holes 244 may be provided in the film 240, and the plurality of drain holes 244 may be horizontally spaced apart from the plurality of communication holes 242. As described above, the drain hole 244 may be connected to the drain groove 234, such that pure water, remaining on the upper surface of the film 240, may pass through the drain hole 244 and be accommodated in the drain groove 234. At least one end of the drain hole 244 may also be open toward an outer peripheral surface (e.g., a side surface) of the film 240. For example, each drain hole 244 may have a zigzag shape in a plan view, the drain hole 244 having the zigzag shape may be formed from a top surface of the film 240 to a bottom surface of the film 240 through the whole thickness of the film 240, one end of the zigzag shape of the drain hole 244 may be formed on a side surface (the peripheral surface) of the film 240, and the other end of the drain hole 244 may be formed at a central area of the film 240 as shown in FIG. 3. Accordingly, the pure water, accommodated in the drain hole 244, may be discharged to the outer peripheral surface of the film 240. The pure water may not remain on the upper surface of the film 240, but may be accommodated in the drain groove 234 of the chuck table 230 through the drain hole 244, or may be discharged to the outer peripheral surfaces (e.g., peripheral surfaces or side surfaces) of the chuck table 230 and the film 240 through the drain hole 244 and the drain groove 234, such that frictional force between the film 240 and the wafer W may increase, thereby preventing the wafer W from slipping on the film 240.

As illustrated in FIG. 4, the drain hole 244 may have a zigzag shape, when viewed from above (e.g., in a plan view). As an example, one end of the drain hole 244 may be open toward the outer peripheral surface of the film 240, and the other end of the drain hole 244 may be disposed on the outside of a central portion or at a central portion (e.g., adjacent to a center) of the film 240. For example, only the communication hole 242 may be disposed in the central portion of the film 240, and the drain hole 244 may not be disposed in the central portion of the film 240. A plurality of drain holes 244 having a zigzag shape may be disposed on the inside of a straight virtual band b. The straight virtual band b may be a region of the film 240 having a straight band shape, and the description of the straight virtual band b in relation to FIG. 3 may be applied to the present embodiment. In addition, the plurality of drain holes 244 may be disposed in one direction, e.g., disposed in parallel. As an example, six drain holes 244 may be provided in the film 240. However, the number of drain holes is not limited thereto, and less than six drain holes 244 or seven or more drain holes 244 may be provided in the film 240. When viewed from above (e.g., in a plan view), an angle θ between a portion of a drain hole 244 extending in one direction and another portion of the drain hole 244 extending in another direction may form an acute angle. For example, the angle θ may be an angle formed between two parts of the zigzag shape of the drain hole 244 extending different direction from each other and meeting at a vertex of the zigzag shape of the drain hole 244 as shown in FIG. 4.

In addition, the drain hole 244 and the drain groove 234 of the chuck table 230 may have the same shape, e.g., in a plan view, and thus the above description of the drain hole 244 may also be applied to the drain groove 234 of the chuck table 230. For example, the plurality of drain holes 244 may vertically fully overlap respective drain grooves 234 formed in the chuck table 230.

Figure 5:
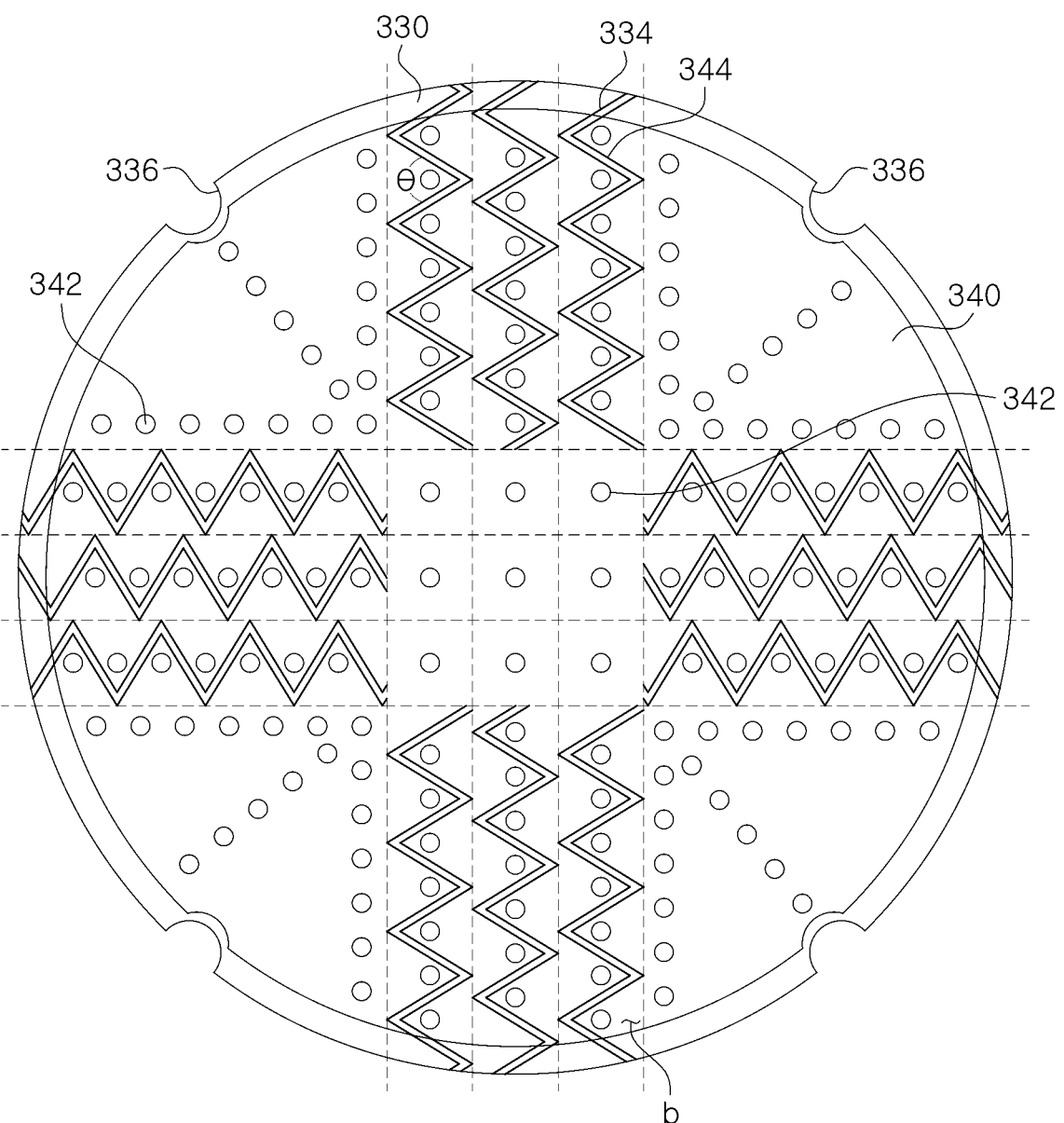

FIG. 5 is a plan view of a chuck table and a film of a buffing cleaning apparatus according to an example embodiment.

Referring to FIG. 5, a film 340 may be disposed on an upper surface of a chuck table 330, and may have a communication hole 342 corresponding to (e.g., vertically overlapping) a vacuum hole (not illustrated in FIG. 5, but refer to the vacuum hole 132 of FIG. 2) of the chuck table 330. Accordingly, a wafer W (see FIG. 2) may be adsorbed on an upper surface of the film 340. A plurality of communication holes 342 may be provided in the film 340, and may be evenly distributed over the entire region of the film 340. The film 340 may have a drain hole 344 connected to a drain groove 334 of the chuck table 330 such that the drain hole 344 does not interfere with the communication hole 342. For example, a plurality of drain holes 344 may be provided in the film 340, and the plurality of drain holes 344 may be horizontally spaced apart from the plurality of communication holes 342. As described above, the drain hole 344 may be connected to the drain groove 334, such that pure water, remaining on the upper surface of the film 340, may pass through the drain hole 344 and be accommodated in the drain groove 334. For example, a plurality of drain grooves 334 may be provided in the chuck table 330 such that the plurality of drain grooves 224 overlap the plurality of drain holes 344 in a vertical direction. At least one end of the drain hole 344 may also be open toward an outer peripheral surface (e.g., a side surface) of the film 340. Accordingly, the pure water, accommodated in the drain hole 344, may be discharged to the outer peripheral surface (e.g. a side surface) of the film 340. The pure water may not remain on the upper surface of the film 340, but may be accommodated in the drain groove 334 of the chuck table 330 through the drain hole 344, or may be discharged to the outer peripheral surfaces (e.g., peripheral surfaces or side surfaces) of the chuck table 330 and the film 340 through the drain hole 344 and the drain groove 334, such that frictional force between the film 340 and the wafer W may increase, thereby preventing the wafer W from slipping on the film 340.

As illustrated in FIG. 5, the drain hole 344 may have a zigzag shape, when viewed from above (e.g., in a plan view). As an example, one end of the drain hole 344 may be open toward the outer peripheral surface (e.g., a peripheral surface or a side surface) of the film 340, and the other end of the drain hole 344 may be disposed on the outside of a central portion of the film 340 or a central portion of the film 340 (e.g., near a center of the film 340). For example, only the communication hole 342 may be disposed in the central portion of the film 340, and the drain hole 344 may not be disposed in the central portion of the film 340. Each of the plurality of drain holes 344 having a zigzag shape may be disposed on the inside of a straight virtual band b. The straight virtual band b may be a region of the film 340 having a straight band shape, and the description of the straight virtual band b in relation to FIG. 3 may be applied to the present embodiment. In addition, some drain holes 344, among the plurality of drain holes 344, may be disposed in a first horizontal direction, e.g., to be in parallel, and the other or some other drain holes 344, among the plurality of drain holes 344, may be disposed in a second horizontal direction, perpendicular to the first horizontal direction. As an example, twelve drain holes 344 may be provided. However, the number of drain holes is not limited thereto, and less than twelve drain holes 344 or twelve or more drain holes 344 may be provided. When viewed from above (e.g., in a plan view), an angle θ between a portion of a drain hole 344 extending in one direction and another portion of the drain hole 344 extending in another direction may form an acute angle. For example, the angle θ may be an angle formed between two parts of the zigzag shape of the drain hole 344 extending in different directions from each other and meeting at a vertex of the zigzag shape of the drain hole 344 as shown in FIG. 5.

In addition, the drain hole 344 and the drain groove 334 of the chuck table 330 may have the same shape, and thus the above description of the drain hole 344 may also be applied to the drain groove 334 of the chuck table 330. For example, each drain hole 344 may vertically overlap a corresponding drain groove 334, and the drain hole 344 and the drain groove 334 may be congruent in a plan view.

Because the drain holes 344 of the film 340 and the drain grooves 334 of the check table 330 are congruent in the plan view, the drain grooves 334 may also be disposed in respective straight virtual bands. This is also applied to other embodiments of the present disclosure.

Figure 6:
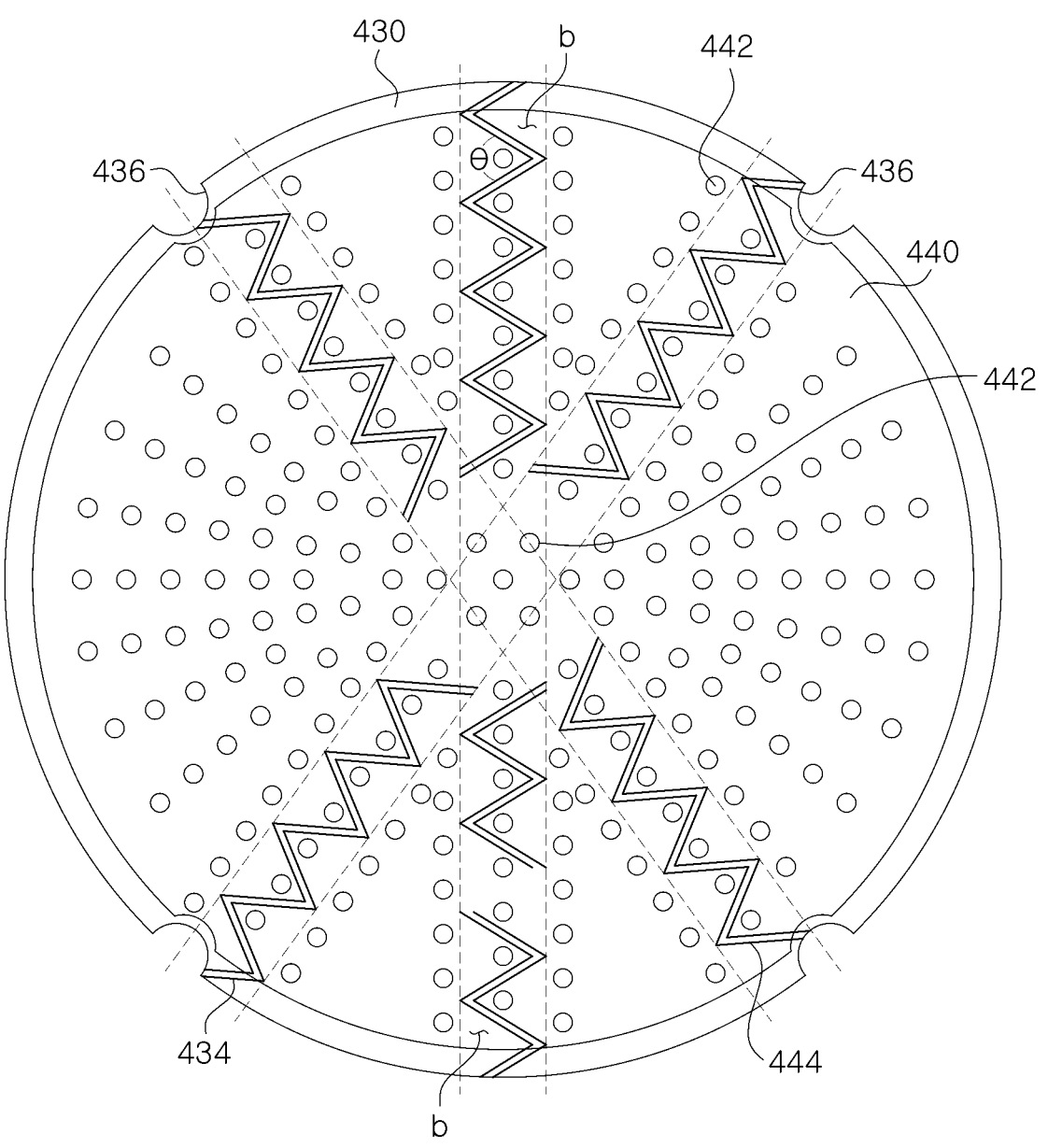

FIG. 6 is a plan view of a chuck table and a film of a buffing cleaning apparatus according to an example embodiment.

Referring to FIG. 6, a film 440 may be disposed on an upper surface of a chuck table 430, and may have a communication hole 442 corresponding to (e.g., vertically overlapping) a vacuum hole (not illustrated in FIG. 6, but refer to the vacuum hole 132 of FIG. 2) of the chuck table 430. Accordingly, a wafer W (see FIG. 2) may be adsorbed on an upper surface of the film 440. A plurality of communication holes 442 may be provided in the film 440, and may be evenly distributed over the entire region of the film 440. The film 440 may have a drain hole 444 connected to a drain groove 434 of the chuck table 430 such that the drain hole 444 does not interfere with the communication hole 442. For example, a plurality of drain holes 444 may be provided in the film 440 such that each of the plurality of drain holes 444 is horizontally spaced apart from the plurality of communication holes 442. As described above, the drain hole 444 may be connected to the drain groove 434, such that pure water, remaining on the upper surface of the film 440, may pass through the drain hole 444 and be accommodated in the drain groove 434. At least one end of the drain hole 444 may also be open toward an outer peripheral surface (e.g., a side surface) of the film 440. Accordingly, the pure water, accommodated in the drain hole 444, may be discharged to the outer peripheral surface of the film 440. The pure water may not remain on the upper surface of the film 440, but may be accommodated in the drain groove 434 of the chuck table 430 through the drain hole 444, or may be discharged to the outer peripheral surfaces (e.g., peripheral surfaces or side surfaces) of the chuck table 430 and the film 440 through the drain hole 444 and the drain groove 434, such that frictional force between the film 440 and the wafer W may increase, thereby preventing the wafer W from slipping on the film 440.

As illustrated in FIG. 6, the drain hole 444 may have a zigzag shape, when viewed from above (e.g., in a plan view). As an example, one end of the drain hole 444 may be open toward the outer peripheral surface of the film 440, and the other end of the drain hole 444 may be disposed on the outside of a central portion of the film 440 or a central portion of the film 440 (e.g., near a center of the film 440). For example, only the communication hole 442 may be disposed in the central portion of the film 440, and the drain hole 444 may not be disposed in the central portion of the film 440. Each of the plurality of drain holes 444 may have a zigzag shape and the plurality of drain holes 444 may be radially disposed, and may be disposed on the inside of a straight virtual band b. The straight virtual band b may be a region of the film 440 having a straight band shape, and the description of the straight virtual band b in relation to FIG. 3 may be applied to the present embodiment. As an example, six drain holes 444 may be provided. However, the number of drain holes is not limited thereto, and less than six drain holes 444 may be provided. When viewed from above (e.g., in a plan view), an angle θ between a portion of a drain hole 444 extending in one direction (e.g., a horizontal direction) and another portion of the drain hole 444 extending in another direction may form an acute angle. For example, the angle θ may be an angle formed between two parts of the zigzag shape of the drain hole 444 extending different direction from each other and meeting at a vertex of the zigzag shape of the drain hole 444 as shown in FIG. 6.

In addition, the drain hole 444 and the drain groove 434 of the chuck table 430 may have the same shape, and thus the above description of the drain hole 444 may also be applied to the drain groove 434 of the chuck table 430.

Figure 7:
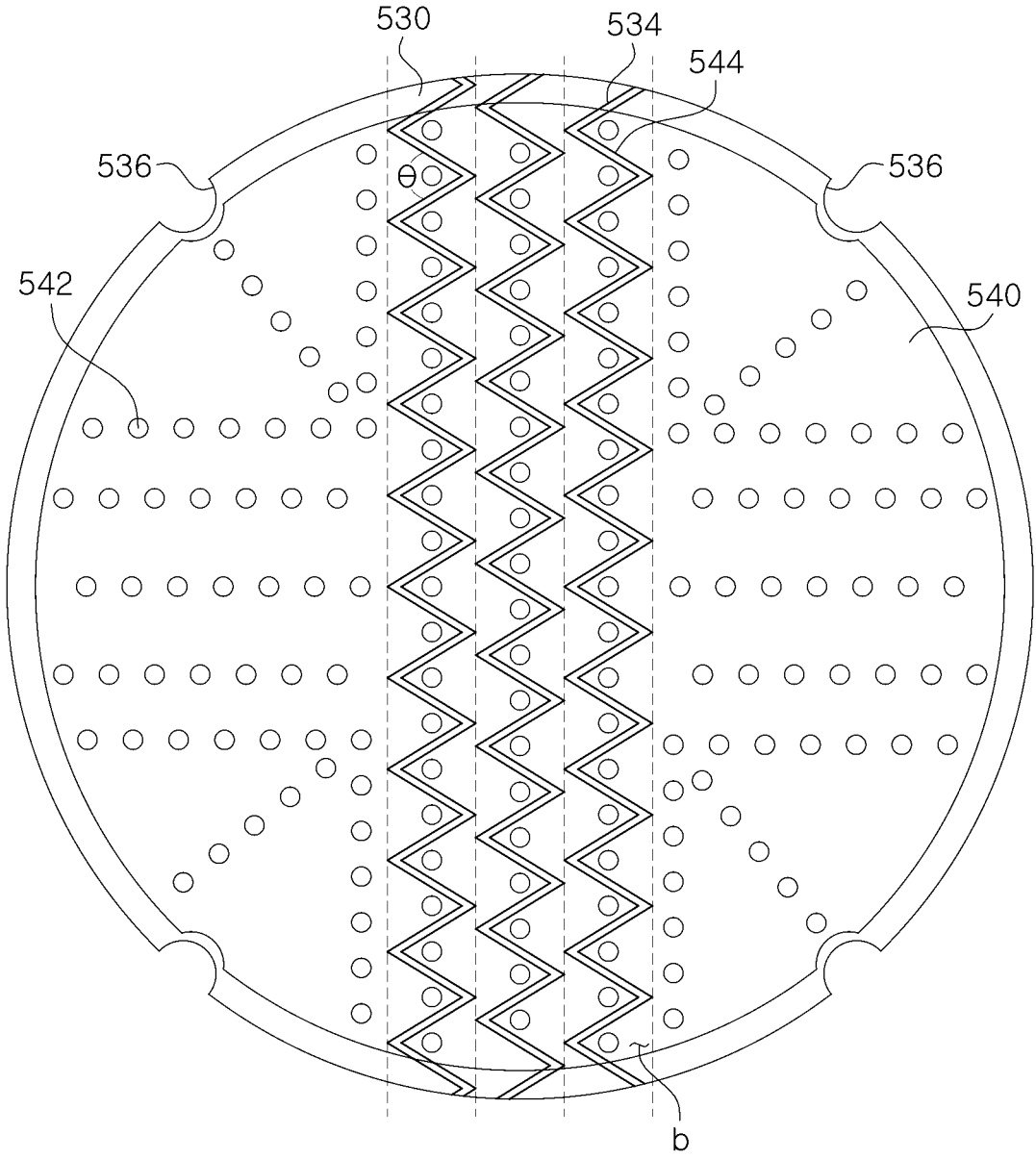

FIG. 7 is a plan view of a chuck table and a film of a buffing cleaning apparatus according to an example embodiment.

Referring to FIG. 7, a film 540 may be disposed on an upper surface of a chuck table 530, and may have a communication hole 542 corresponding to (e.g., vertically overlapping) a vacuum hole (not illustrated in FIG. 7, but refer to the vacuum hole 132 of FIG. 2) of the chuck table 530. Accordingly, a wafer W (see FIG. 2) may be adsorbed on an upper surface of the film 540. A plurality of communication holes 542 may be provided, and may be evenly distributed over the entire region of the film 540. The film 540 may have a drain hole 544 connected to a drain groove 534 of the chuck table 530 such that the drain hole 544 does not interfere with the communication hole 542. As described above, the drain hole 544 may be connected to the drain groove 534, such that pure water, remaining on the upper surface of the film 540, may pass through the drain hole 544 and be accommodated in the drain groove 534. Opposite ends of the drain hole 544 may be open toward an outer peripheral surface of the film 540. Accordingly, the pure water, accommodated in the drain hole 544, may be discharged to the outer peripheral surface of the film 540. The pure water may not remain on the upper surface of the film 540, but may be accommodated in the drain groove 534 of the chuck table 530 through the drain hole 544, or may be discharged to the outer peripheral surfaces (e.g., peripheral surfaces or side surfaces) of the chuck table 530 and the film 540 through the drain hole 544 and the drain groove 534, such that frictional force between the film 540 and the wafer W may increase, thereby preventing the wafer W from slipping on the film 540.

As illustrated in FIG. 7, the drain hole 544 may have a zigzag shape, when viewed from above (e.g., in a plan view). As an example, opposite ends of the drain hole 544 may be open toward the outer peripheral surface of the film 540. A plurality of drain holes 544 having a zigzag shape may be disposed on the inside of a straight virtual band b. The straight virtual band b may be a region of the film 540 having a straight band shape, and the description of the straight virtual band b in relation to FIG. 3 may be applied to the present embodiment. In addition, the plurality of drain holes 544 may be disposed in one direction, e.g., arranged in parallel. As an example, three drain holes 544 may be provided in the film 540. However, the number of drain holes is not limited thereto, and less than three drain holes 544 or four or more drain holes 544 may be provided in the film 540. When viewed from above (e.g., in a plan view), an angle θ between a portion of a drain hole 544 extending in one direction and another portion of the drain hole 544 extending in another direction may form an acute angle. For example, the angle θ may be an angle formed between two parts of the zigzag shape of the drain hole 544 extending different direction from each other and meeting at a vertex of the zigzag shape of the drain hole 544 as shown in FIG. 7.

In addition, the drain hole 544 in the film 540 and the drain groove 534 of the chuck table 530 may have the same shape, e.g., in a plan view, and thus the above description of the drain hole 544 may also be applied to the drain groove 534 of the chuck table 530.

Figure 8:
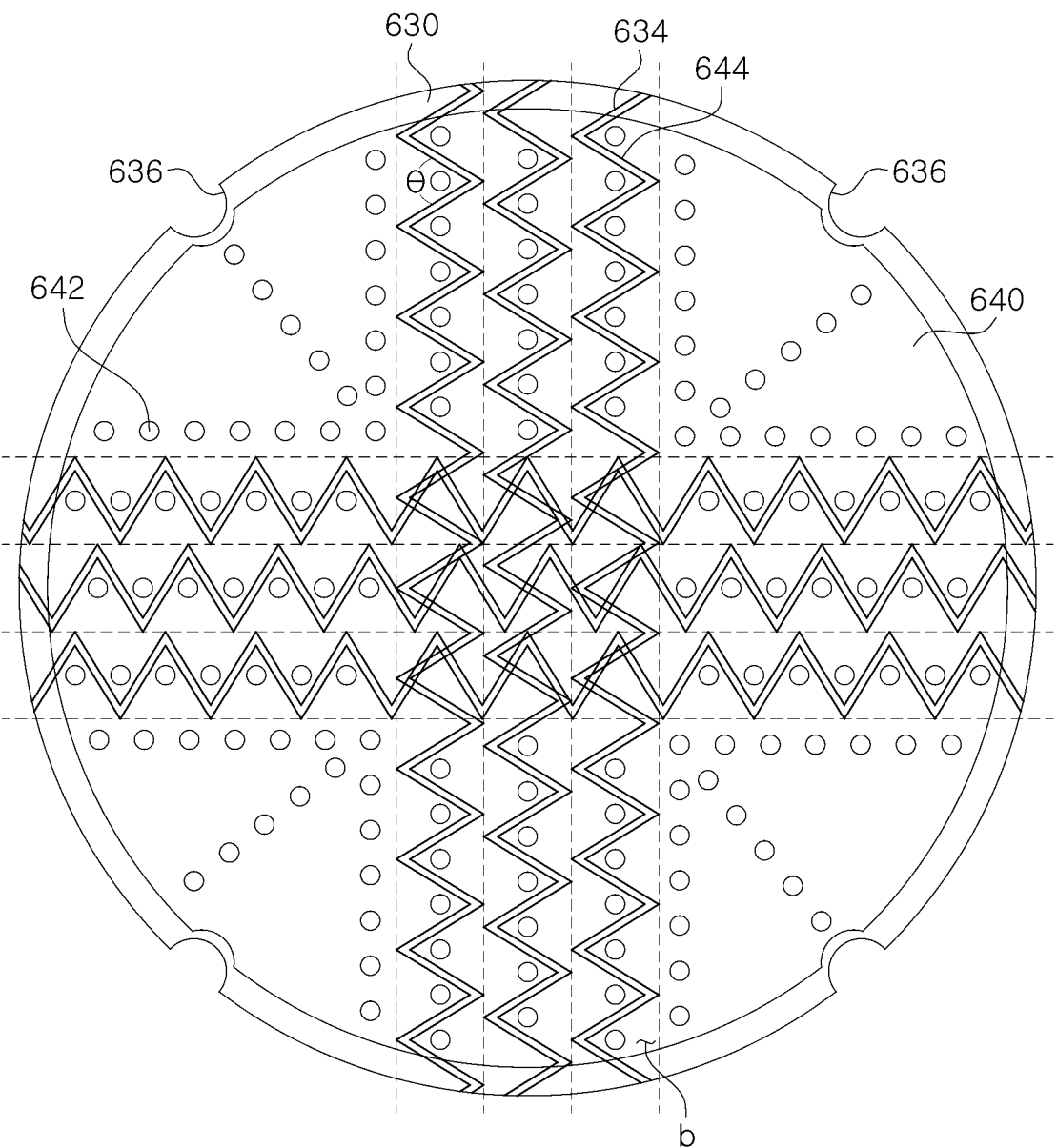

FIG. 8 is a plan view of a chuck table and a film of a buffing cleaning apparatus according to an example embodiment.

Referring to FIG. 8, a film 640 may be disposed on an upper surface of a chuck table 630, and may have a communication hole 642 corresponding to (e.g., vertically overlapping) a vacuum hole (not illustrated in FIG. 8, but refer to the vacuum hole 132 of FIG. 2) of the chuck table 630. Accordingly, a wafer W (see FIG. 2) may be adsorbed on an upper surface of the film 640. A plurality of communication holes 642 may be provided in the film 640, and may be evenly distributed over the entire region of the film 640. The film 640 may have a drain hole 644 connected to a drain groove 634 of the chuck table 630 such that the drain hole 644 does not interfere with the communication hole 642. As described above, the drain hole 644 may be connected to the drain groove 634, such that pure water, remaining on the upper surface of the film 640, may pass through the drain hole 644 and be accommodated in the drain groove 634. Opposite ends of the drain hole 644 may be open toward an outer peripheral surface of the film 640. Accordingly, the pure water, accommodated in the drain hole 644, may be discharged to the outer peripheral surface of the film 640. The pure water may not remain on the upper surface of the film 640, but may be accommodated in the drain groove 634 of the chuck table 630 through the drain hole 644, or may be discharged to the outer peripheral surfaces (e.g., peripheral surfaces or side surfaces) of the chuck table 630 and the film 640 through the drain hole 644 and the drain groove 634, such that frictional force between the film 640 and the wafer W may increase, thereby preventing the wafer W from slipping on the film 640.

As illustrated in FIG. 8, the drain hole 644 may have a zigzag shape, when viewed from above (e.g., in a plan view). As an example, opposite ends of the drain hole 644 may be open toward the outer peripheral surface of the film 640. Each of a plurality of drain holes 644 having a zigzag shape may be disposed on the inside of a straight virtual band b. The straight virtual band b may be a region of the film 640 having a straight band shape, and the description of the straight virtual band b in relation to FIG. 3 may be applied to the present embodiment. In addition, some drain holes 644, among the plurality of drain holes 644, may be disposed in one direction, and the other drain holes 644, among the plurality of drain holes 644, may be disposed in a direction perpendicular to the one direction. For example, some straight virtual bands b of the drain holes 644 may extend lengthwise in the one direction (e.g., a first direction), and the other straight virtual bands b of the drain holes 644 may extend lengthwise in the direction (e.g., a second direction) perpendicular to the one direction. As an example, six drain holes 644 may be provided in the film 640. However, the number of drain holes is not limited thereto, and less than six drain holes 644 or seven or more drain holes 644 may be provided in the film 640. When viewed from above (e.g., in a plan view), an angle θ between a portion of a drain hole 644 extending in one direction and another portion of the drain hole 644 extending in another direction may form an acute angle. For example, the angle θ may be an angle formed between two parts of the zigzag shape of the drain hole 644 extending different direction from each other and meeting at a vertex of the zigzag shape of the drain hole 644 as shown in FIG. 8.

In addition, the drain hole 644 and the drain groove 634 of the chuck table 630 may have the same shape, e.g., in a plan view, and thus the above description of the drain hole 644 may also be applied to the drain groove 634 of the chuck table 630.

Figure 9:
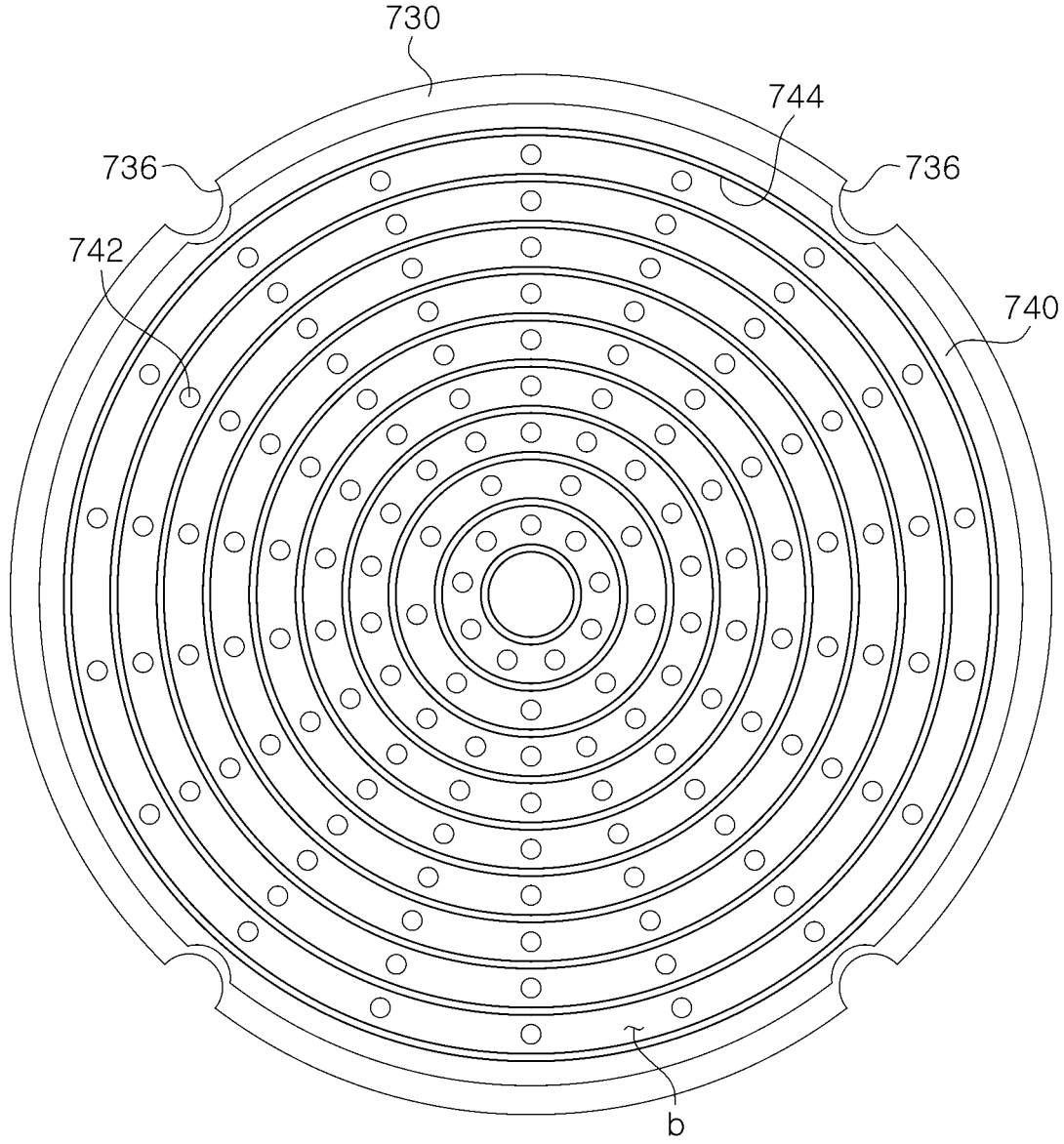

FIG. 9 is a plan view of a chuck table and a film of a buffing cleaning apparatus according to an example embodiment.

Referring to FIG. 9, a film 740 may be disposed on an upper surface of a chuck table 730, and may have a communication hole 742 corresponding to (e.g., vertically overlapping) a vacuum hole (not illustrated in FIG. 9, but refer to the vacuum hole 132 of FIG. 2) of the chuck table 730. Accordingly, a wafer W (see FIG. 2) may be adsorbed on an upper surface of the film 740. A plurality of communication holes 742 may be provided in the film 740, and may be evenly distributed over the entire region of the film 740. The film 740 may have a drain hole 744 connected to a drain groove 734 of the chuck table 730 such that the drain hole 744 does not interfere with the communication hole 742. As described above, the drain hole 744 may be connected to the drain groove 734, such that pure water, remaining on the upper surface of the film 740, may pass through the drain hole 744 and be accommodated in the drain groove 734. The pure water may not remain on the upper surface of the film 740, but may be accommodated in the drain groove 734 of the chuck table 730 through the drain hole 744, such that frictional force between the film 740 and the wafer W may increase, thereby preventing the wafer W from slipping on the film 740. As an example, the plurality of drain holes 744 may have circular shapes having different diameters, when viewed from above (e.g., in a plan view). For example, the circular drain holes 744 may be arranged to be concentric circles in a plan view as shown in FIG. 9.

In addition, the drain holes 744 of the film 740 and the drain grooves 734 of the chuck table 730 may have the same shape, e.g., in a plan view, and thus the above description of the drain hole 744 may also be applied to the drain groove 734 of the chuck table 730. For example, the drain holes 744 of the film 740 and the drain grooves 734 of the chuck table 730 may be congruent in a plan view.

Figure 10:
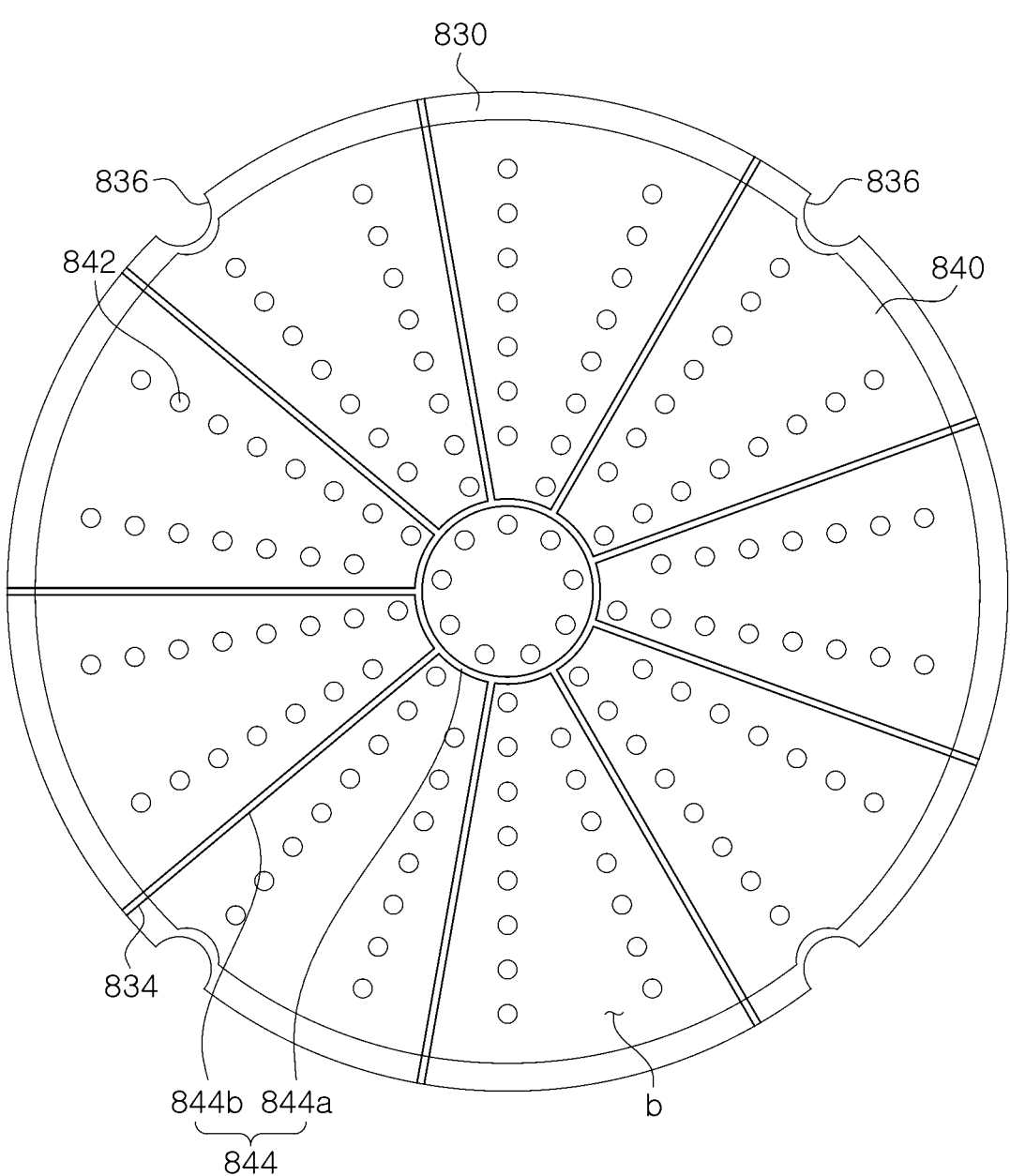

FIG. 10 is a plan view of a chuck table and a film of a buffing cleaning apparatus according to an example embodiment.

Referring to FIG. 10, a film 840 may be disposed on an upper surface of a chuck table 830, and may have a communication hole 842 corresponding to (e.g., vertically overlapping) a vacuum hole (not illustrated in FIG. 10, but refer to the vacuum hole 132 of FIG. 2) of the chuck table 830. Accordingly, a wafer W (see FIG. 2) may be adsorbed on an upper surface of the film 840. A plurality of communication holes 842 may be provided, and may be evenly distributed over the entire region of the film 840. The film 840 may have a drain hole 844 connected to a drain groove 834 of the chuck table 830 such that the drain hole 844 does not interfere with the communication hole 842. As described above, the drain hole 844 may be connected to the drain groove 834, such that pure water, remaining on the upper surface of the film 840, may pass through the drain hole 844 and be accommodated in the drain groove 834. The pure water may not remain on the upper surface of the film 840, but may be accommodated in the drain groove 834 of the chuck table 830 through the drain hole 844, such that frictional force between the film 840 and the wafer W may increase, thereby preventing the wafer W from slipping on the film 840. As an example, when viewed from above (e.g., in a plan view), the drain hole 844 may have a circular portion 844a disposed in a central portion of the film 840, and a radial portion 844b disposed radially from the circular portion 844a.

One end of the radial portion 844b may be open toward an outer peripheral surface of the film 840. Accordingly, the pure water, accommodated in the drain hole 844, may be discharged to the outer peripheral surface of the film 840. As described above, the pure water may not remain on the upper surface of the film 840, but may be discharged to the outer peripheral surfaces (e.g., peripheral surfaces or side surfaces) of the chuck table 830 and the film 840 through the drain hole 844 and the drain groove 834, such that frictional force between the film 840 and the wafer W may increase, thereby preventing the wafer W from slipping on the film 840.

In addition, the drain hole 844 of the film 840 and the drain groove 834 of the chuck table 830 may have the same shape, e.g., in a plan view, and thus the above description of the drain hole 844 may also be applied to the drain groove 834 of the chuck table 830.

Figure 11:
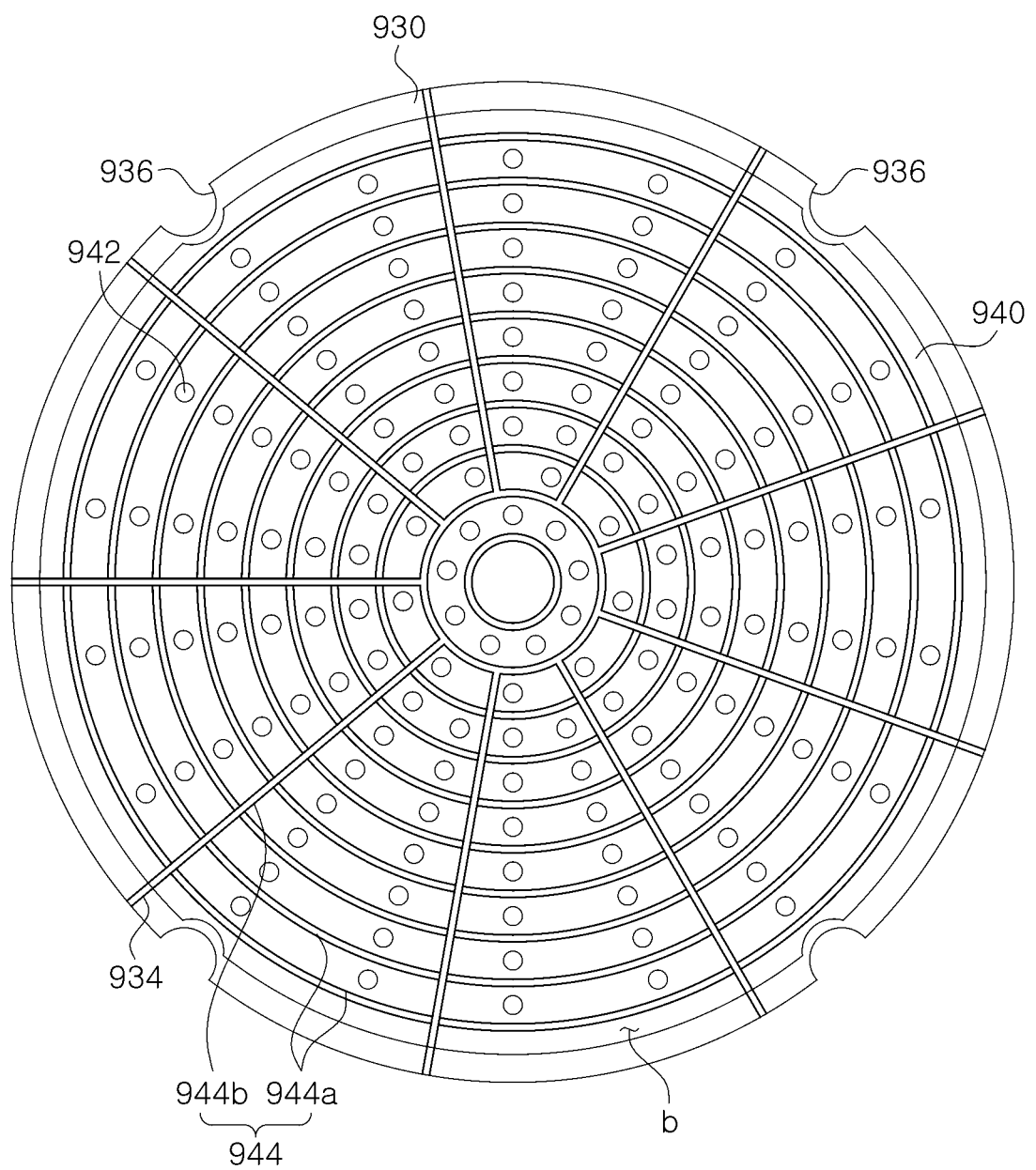

FIG. 11 is a plan view of a chuck table and a film of a buffing cleaning apparatus according to an example embodiment.

Referring to FIG. 11, a film 940 may be disposed on an upper surface of a chuck table 930, and may have a communication hole 942 corresponding to (e.g., vertically overlapping) a vacuum hole (not illustrated in FIG. 11, refer to the vacuum hole 132 of FIG. 2) of the chuck table 930. Accordingly, a wafer W (see FIG. 2) may be adsorbed on an upper surface of the film 940. A plurality of communication holes 942 may be provided, and may be evenly distributed over the entire region of the film 940. The film 940 may have a drain hole 944 connected to a drain groove 934 of the chuck table 930 such that the drain hole 944 does not interfere with the communication hole 942. As described above, the drain hole 944 may be connected to the drain groove 934, such that pure water, remaining on the upper surface of the film 940, may pass through the drain hole 944 and be accommodated in the drain groove 934. The pure water may not remain on the upper surface of the film 940, but may be accommodated in the drain groove 934 of the chuck table 930 through the drain hole 944, such that frictional force between the film 940 and the wafer W may increase, thereby preventing the wafer W from slipping on the film 940. As an example, when viewed from above (e.g., in a plan view), the drain hole 944 may have a plurality of circular portions 944a having different diameters, and a radial portion 944b disposed radially to intersect the circular portions 944a. One end of the radial portion 944b may be disposed to extend from an innermost circular portion 944a or a second innermost circular portion 944a. Throughout the embodiments of the present disclosure, some of drain holes and/or drain grooves may be isolated from some others of drain holes and/or the drain grooves, and/or from peripheral surfaces, and some others of the drain holes and/or the drain grooves may be connected to each other and/or to a peripheral surface of the film or the chuck table as shown in some figures of the present disclosure. When one part of the drain holes or the drain grooves intersects another part of the drain holes or the drain grooves in a plan view, the two parts may be connected to each other at the region of the intersection or may be still isolated by a wall or by crossing over the other part of the intersecting part in the plan view. The other end of the radial portion 944b may be open toward an outer peripheral surface of the film 940. Accordingly, the pure water, accommodated in the drain hole 944, may be discharged to the outer peripheral surface of the film 940. As described above, the pure water may not remain on the upper surface of the film 940, but may be discharged to the outer peripheral surfaces (e.g., peripheral surfaces or side surfaces) of the chuck table 930 and the film 940 through the drain hole 944 and the drain groove 934, such that frictional force between the film 940 and the wafer W may increase, thereby preventing the wafer W from slipping on the film 940.

In addition, the drain hole 944 and the drain groove 934 of the chuck table 930 may have the same shape, and thus the above description of the drain hole 944 may also be applied to the drain groove 934 of the chuck table 930.

Figure 12:
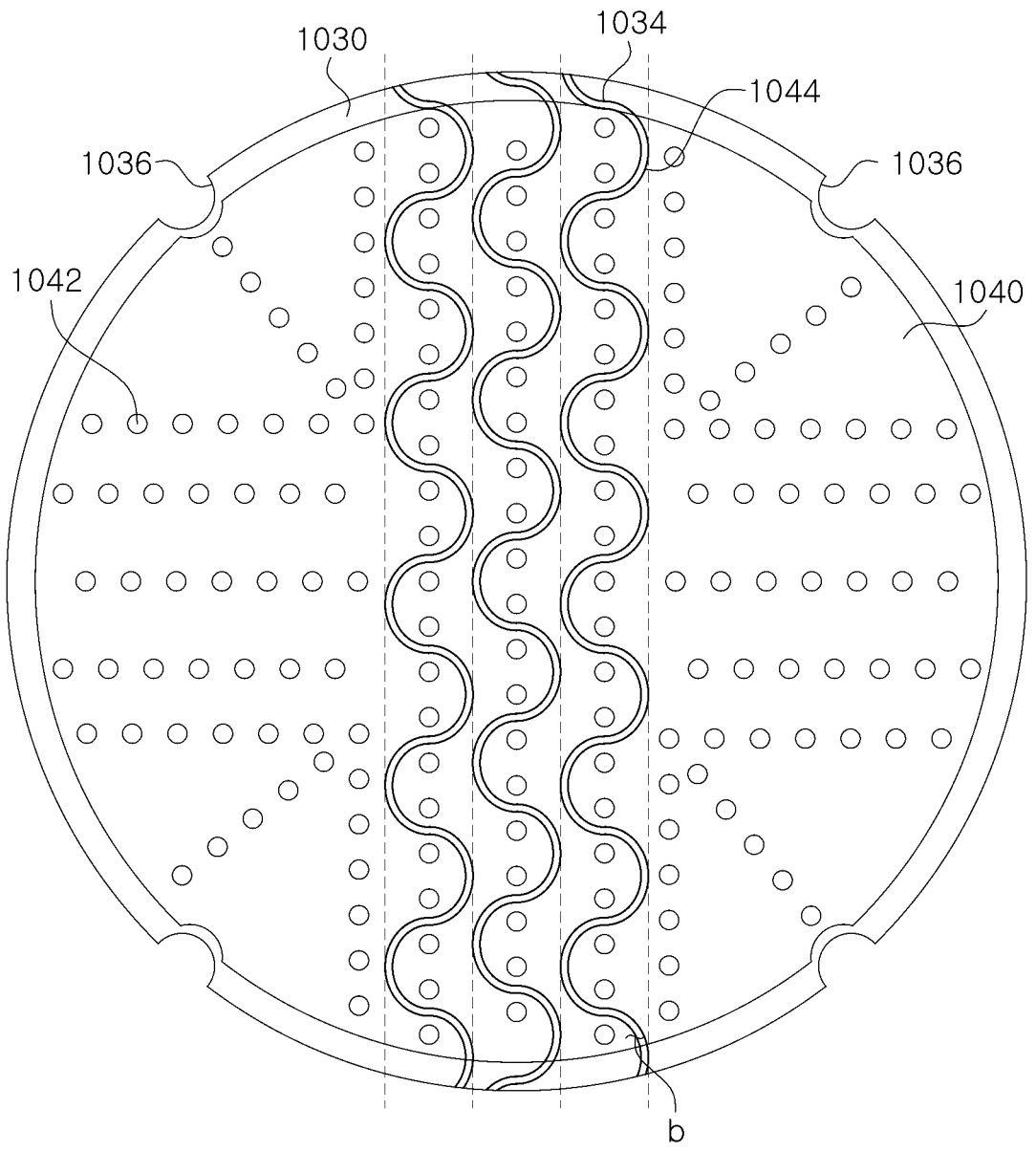

FIG. 12 is a plan view of a chuck table and a film of a buffing cleaning apparatus according to an example embodiment.

Referring to FIG. 12, a film 1040 may be disposed on an upper surface of a chuck table 1030, and may have a communication hole 1042 corresponding to (e.g., vertically overlapping) a vacuum hole (not illustrated in FIG. 12, refer to the vacuum hole 132 of FIG. 2) of the chuck table 1030. Accordingly, a wafer W (see FIG. 2) may be adsorbed on an upper surface of the film 1040. A plurality of communication holes 1042 may also be provided, and may be evenly distributed over the entire region of the film 1040. The film 1040 may have a drain hole 1044 connected to a drain groove 1034 of the chuck table 1030 such that the drain hole 1044 does not interfere with the communication hole 1042. As described above, the drain hole 1044 may be connected to the drain groove 1034, such that pure water, remaining on the upper surface of the film 1040, may pass through the drain hole 1044 and be accommodated in the drain groove 1034. The pure water may not remain on the upper surface of the film 1040, but may be accommodated in the drain groove 1034 of the chuck table 1030 through the drain hole 1044, such that frictional force between the film 1040 and the wafer W may increase, thereby preventing the wafer W from slipping on the film 1040. As an example, as illustrated in FIG. 12, the drain hole 1044 may have a zigzag shape, when viewed from above (e.g., in a plan view). As an example, opposite ends of the drain hole 1044 may be open toward an outer peripheral surface of the film 1040. A plurality of drain holes 1044 having a zigzag shape may be disposed on the inside of a straight virtual band b as shown in FIG. 12. The straight virtual band b may be a region of the film 1040 having a straight band shape. In addition, the plurality of drain holes 1044 may be disposed in one direction (e.g., disposed in parallel). As an example, three drain holes 1044 may be provided. However, the number of drain holes is not limited thereto, and less than three drain holes 1044 or four or more drain holes 1044 may be provided. When viewed from above (e.g., in a plan view), a region of one drain hole 1044 in which a direction changes may have a curved/round shape.

In addition, the drain hole 1044 and the drain groove 1034 of the chuck table 1030 may have the same shape, and thus the above description of the drain hole 1044 may also be applied to the drain groove 1034 of the chuck table 1030.

Figure 13:
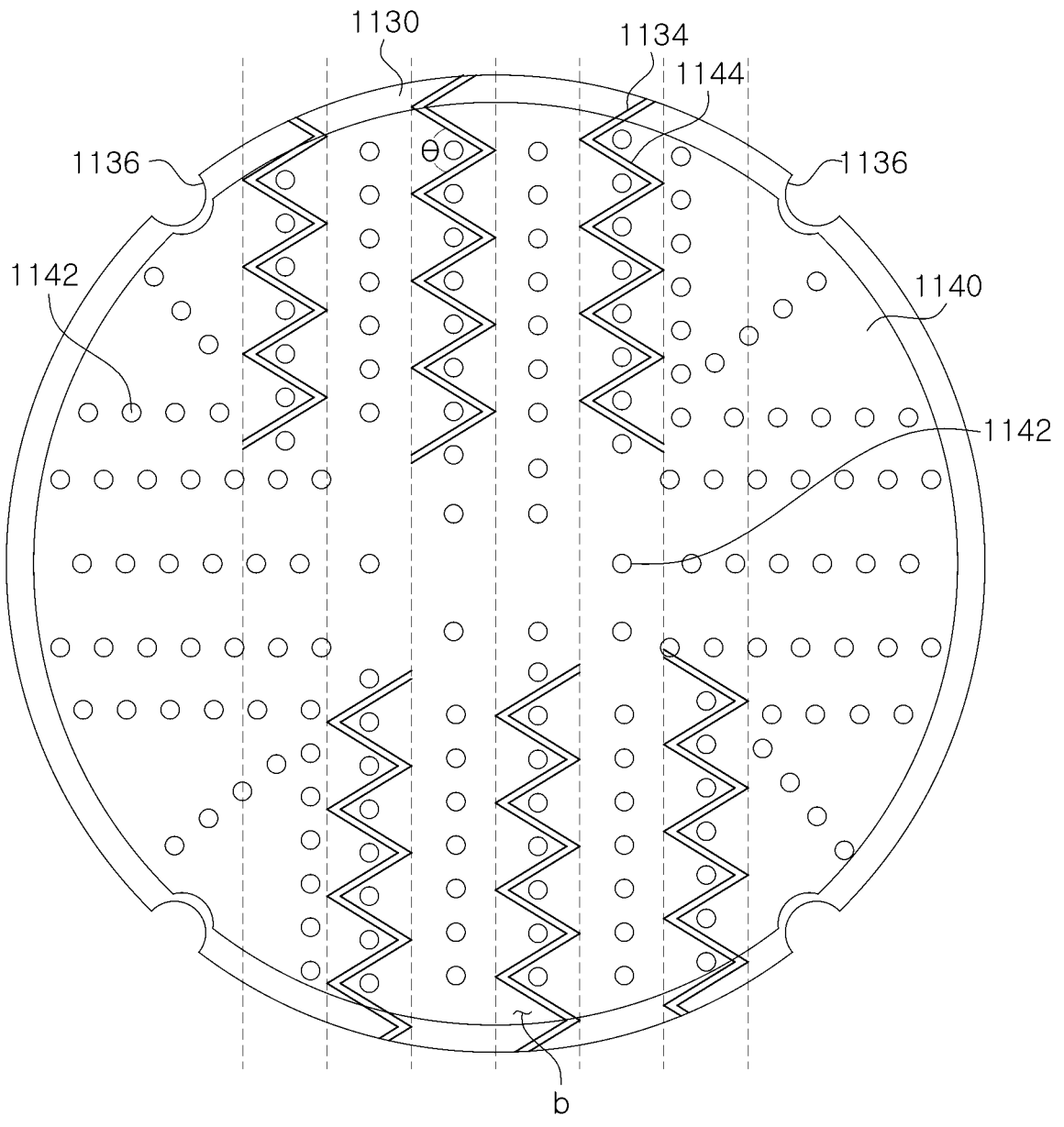

FIG. 13 is a plan view of a chuck table and a film of a buffing cleaning apparatus according to an example embodiment.

Referring to FIG. 13, a film 1140 may be disposed on an upper surface of a chuck table 1130, and may have a communication hole 1142 corresponding to (e.g., vertically overlapping) a vacuum hole (not illustrated in FIG. 13, refer to the vacuum hole 132 of FIG. 2) of the chuck table 1130. Accordingly, a wafer W (see FIG. 2) may be adsorbed on an upper surface of the film 1140. A plurality of communication holes 1142 may be provided, and may be evenly distributed over the entire region of the film 1140. The film 1140 may have a drain hole 1144 connected to a drain groove 1134 of the chuck table 1130 such that the drain hole 1144 does not interfere with the communication hole 1142. As described above, the drain hole 1144 may be connected to the drain groove 1134, such that pure water, remaining on the upper surface of the film 1140, may pass through the drain hole 1144 and be accommodated in the drain groove 1134. One end of the drain hole 1144 may be open toward an outer peripheral surface of the film 1140. Accordingly, the pure water, accommodated in the drain hole 1144, may be discharged to the outer peripheral surface of the film 1140. The pure water may not remain on the upper surface of the film 1140, but may be accommodated in the drain groove 1134 of the chuck table 1130 through the drain hole 1144, or may be discharged to the outer peripheral surfaces (e.g., peripheral surfaces or side surfaces) of the chuck table 1130 and the film 1140 through the drain hole 1144 and the drain groove 1134, such that frictional force between the film 1140 and the wafer W may increase, thereby preventing the wafer W from slipping on the film 1140.

As illustrated in FIG. 13, the drain hole 1144 may have a zigzag shape, when viewed from above (e.g., in a plan view). As an example, one end of the drain hole 1144 may be open toward the outer peripheral surface of the film 1140, and the other end of the drain hole 1144 may be disposed on the outside of a central portion of the film 1140 or a central portion of the film 1140 (e.g., near a center of the film 1140). For example, only the communication hole 1142 may be disposed in the central portion of the film 1140, and the drain hole 1144 may not be disposed in the central portion of the film 1140. A plurality of drain holes 1144 having a zigzag shape may be disposed on the inside of a straight virtual band b. The straight virtual band b may be a region of the film 1140 having a straight band shape, and the description of the straight virtual band b in relation to FIG. 3 may be applied to the present embodiment. In addition, the plurality of drain holes 1144 may be disposed in one direction (e.g., disposed in parallel). As an example, six drain holes 1144 may be provided. However, the number of drain holes is not limited thereto, and less than six drain holes 1144 or seven or more drain holes 1144 may be provided. In addition, among the plurality of drain holes 1144, some drain holes 1144 disposed on one side (e.g., a first side) of the film 1140 and the other drain holes 1144 disposed on the other side (e.g., a second side) of the film 1140 may be disposed to be staggered with respect to each other. For example, the first sides and the second sides are opposite each other on the upper surface of the film 1140, and straight virtual bands b of the drain holes 1144 and the drain grooves 1134 of the first sides of the chuck table 1130 and the film 1140 do not overlap straight virtual bands of the drain holes 1144 and the drain grooves 1134 of the second sides of the chuck table 1130 and the film 1140. When viewed from above (e.g., in a plan view), an angle θ between a portion of a drain hole 1144 extending in one direction and another portion of the drain hole 1144 extending in another direction may form an acute angle. For example, the angle θ may be an angle formed between two parts of the zigzag shape of the drain hole 1144 extending in different directions from each other and meeting at a vertex of the zigzag shape of the drain hole 1144 as shown in FIG. 13.

In addition, the drain hole 1144 and the drain groove 1134 of the chuck table 1130 may have the same shape, and thus the above description of the drain hole 1144 may also be applied to the drain groove 1134 of the chuck table 1130.

Figure 14:
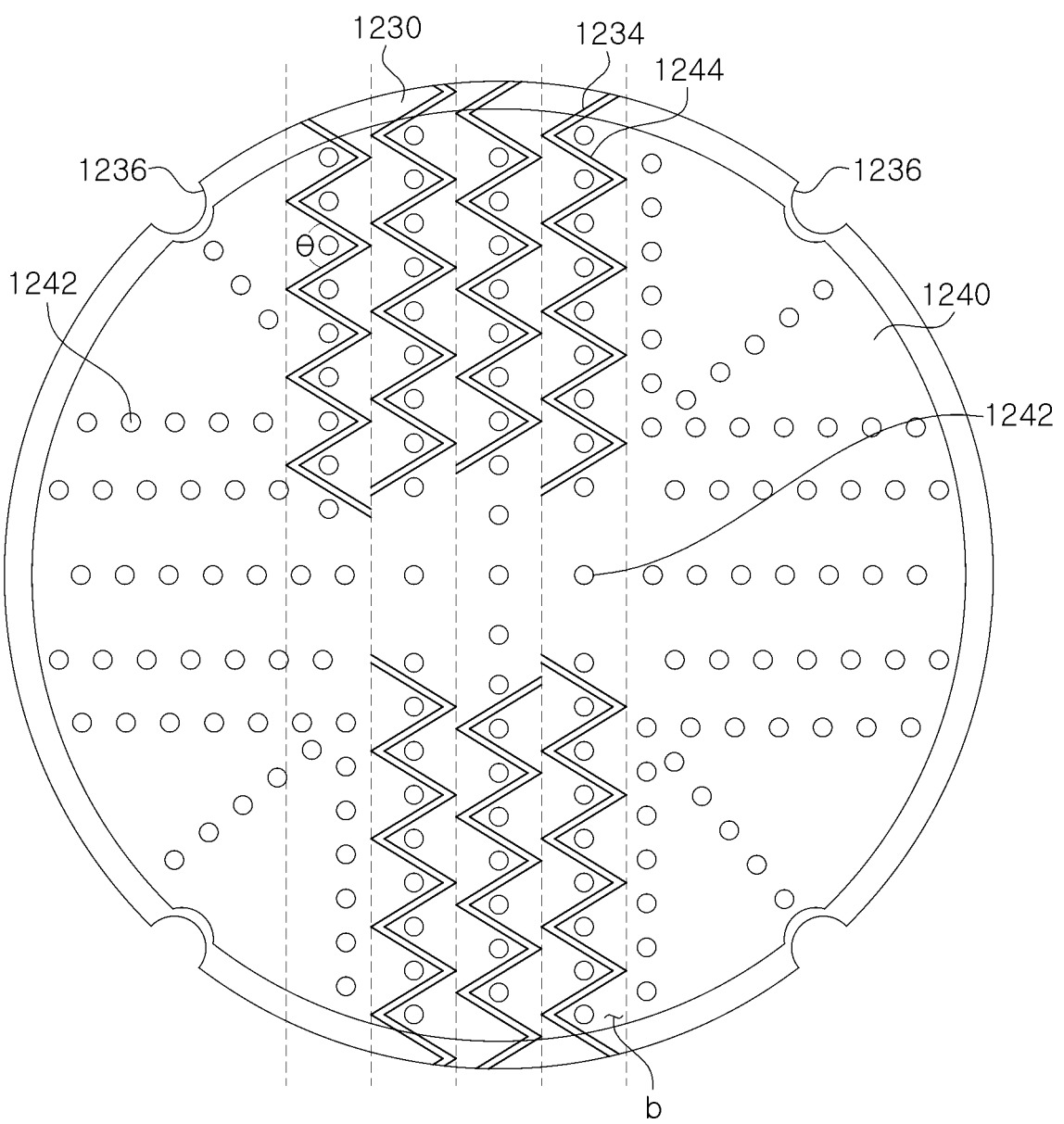

FIG. 14 is a plan view of a chuck table and a film of a buffing cleaning apparatus according to an example embodiment.

Referring to FIG. 14, a film 1240 may be disposed on an upper surface of a chuck table 1230, and may have a communication hole 1242 corresponding to (e.g., vertically overlapping) a vacuum hole (not illustrated in FIG. 14, refer to the vacuum hole 132 of FIG. 2) of the chuck table 1230. Accordingly, a wafer W (see FIG. 2) may be adsorbed on an upper surface of the film 1240. A plurality of communication holes 1242 may be provided, and may be evenly distributed over the entire region of the film 1240. The film 1240 may have a drain hole 1244 connected to a drain groove 1234 of the chuck table 1230 such that the drain hole 1244 does not interfere with the communication hole 1242. As described above, the drain hole 1244 may be connected to the drain groove 1234, such that pure water, remaining on the upper surface of the film 1240, may pass through the drain hole 1244 and be accommodated in the drain groove 1234. One end of the drain hole 1244 may be open toward an outer peripheral surface of the film 1240. Accordingly, the pure water, accommodated in the drain hole 1244, may be discharged to the outer peripheral surface of the film 1240. The pure water may not remain on the upper surface of the film 1240, but may be accommodated in the drain groove 1234 of the chuck table 1230 through the drain hole 1244, or may be discharged to the outer peripheral surfaces (e.g., peripheral surfaces or side surfaces) of the chuck table 1230 and the film 1240 through the drain hole 1244 and the drain groove 1234, such that frictional force between the film 1240 and the wafer W may increase, thereby preventing the wafer W from slipping on the film 1240.

As illustrated in FIG. 14, the drain hole 1244 may have a zigzag shape, when viewed from above (e.g., in a plan view). As an example, one end of the drain hole 1244 may be open toward the outer peripheral surface of the film 1240, and the other end of the drain hole 1244 may be disposed on the outside of a central portion of the film 1240 or a central portion of the film 1240 (e.g., near a center of the film 1240). For example, only the communication hole 1242 may be disposed in the central portion of the film 1240, and the drain hole 1244 may not be disposed in the central portion of the film 1240. A plurality of drain holes 1244 having a zigzag shape may be disposed on the inside of a straight virtual band b. The straight virtual band b may be a region of the film 1240 having a straight band shape, and the description of the straight virtual band b in relation to FIG. 3 may be applied to the present embodiment. In addition, the plurality of drain holes 1244 may be disposed in one direction (e.g., disposed in parallel). As an example, seven drain holes 1244 may be provided. However, the number of drain holes is not limited thereto, and less than seven drain holes 1244 or eight or more drain holes 1244 may be provided. In addition, among the plurality of drain holes 1244, the number of some drain holes 1244 disposed on one side of the film 1240 and the number of the other drain holes 1244 disposed on the other side of the film 1240 may be different from each other. As an example, among the plurality of drain holes 1244, the number of drain holes 1244 disposed on one side of the film 1240 may be four, and the number of drain holes 1244 disposed on the other side of the film 1240 may be three. When viewed from above (e.g., in a plan view), an angle θ between a portion of a drain hole 1244 extending in one direction and another portion of the drain hole 1244 extending in the other direction may form an acute angle. For example, the angle θ may be an angle formed between two parts of the zigzag shape of the drain hole 1244 extending different direction from each other and meeting at a vertex of the zigzag shape of the drain hole 1244 as shown in FIG. 14.

In addition, the drain hole 1244 and the drain groove 1234 of the chuck table 1230 may have the same shape, and thus the above description of the drain hole 1244 may also be applied to the drain groove 1234 of the chuck table 1230.

According to example embodiments of the present inventive concept, a buffing cleaning apparatus may prevent a substrate (wafer) from slipping on a film by improving frictional force between a rear surface of the substrate (wafer) and the film.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context clearly indicates otherwise, and the present disclosure includes the additional embodiments.

While example embodiments have been shown and described above, it will be apparent to those skilled in the art that modifications and variations could be made without departing from the scope of the invention as defined by the appended claims.

What is claimed is:

1. A buffing cleaning apparatus comprising:
a chuck table having a vacuum hole; and
a film disposed on an upper surface of the chuck table, the film having a communication hole vertically overlapping the vacuum hole,
wherein:
an upper surface of the film is configured to receive a wafer,
the film has a drain hole configured to drain liquid through the drain hole, and
the chuck table has a drain groove vertically overlapping the drain hole.

2. The buffing cleaning apparatus of claim 1, wherein:
a plurality of drain holes and a plurality of drain grooves are provided in the film and in the chuck table respectively, and
the plurality of drain holes and the plurality of drain grooves are disposed such that the plurality of drain holes and the plurality of drain grooves do not vertically overlap the communication hole and the vacuum hole.

3. The buffing cleaning apparatus of claim 2, wherein each of the plurality of drain holes and the plurality of drain grooves has a zigzag shape.

4. The buffing cleaning apparatus of claim 3, wherein each of the plurality of drain holes and the plurality of drain grooves has a first end open toward a peripheral surface of the chuck table or the film, and a second end disposed on a central portion of the chuck table or the film.

5. The buffing cleaning apparatus of claim 4, wherein the plurality of drain holes and the plurality of drain grooves are radially disposed.

6. The buffing cleaning apparatus of claim 4, wherein when the film and the chuck table are divided into four equal quadrants along azimuthal angles with respect to the center of the film and the chuck table in a plan view, the plurality of drain holes and the plurality of drain grooves are disposed in two quadrants opposing each other, among the four quadrants.

7. The buffing cleaning apparatus of claim 4, wherein each zigzag shape of the drain holes and the drain grooves has multiple vertices arranged in two parallel lines in a plan view,
wherein, in a plan view, each of the drain holes and the drain grooves is disposed on an inside of a straight virtual band formed by the two parallel lines on which the vertices are arranged and an area between the two parallel lines.

8. The buffing cleaning apparatus of claim 7, wherein, in a plan view, the straight virtual bands of the plurality of drain holes and the plurality of drain grooves extend lengthwise in parallel.

9. The buffing cleaning apparatus of claim 8, wherein among the plurality of drain holes and the plurality of drain grooves, some drain holes and some drain grooves are disposed in first sides of the chuck table and the film, and remaining drain holes and remaining drain grooves are disposed in second sides of the chuck table and the film, the first sides of the film and the chuck table are opposite the second sides of the film and the chuck table, the first side of the film completely overlaps the first side of the chuck table in a vertical direction, the second side of the film completely overlaps the second side of the chuck table in the vertical direction, and each of the first sides and the second sides is a quarter or less than a quarter of the whole area of the film and a quarter or less than a quarter of the whole area of the chuck table in a plan view.

10. The buffing cleaning apparatus of claim 8, wherein, in a plan view, among the plurality of drain holes and the plurality of drain grooves, some drain holes and some drain grooves are disposed in first sides of the chuck table and the film, and remaining drain holes and remaining drain grooves are disposed in second sides of the chuck table and the film, the first sides and the second sides are opposite each other, and straight virtual bands of the drain holes and the drain grooves of the first sides of the chuck table and the film do not overlap straight virtual bands of the drain holes and the drain grooves of the second sides of the chuck table and the film.

11. The buffing cleaning apparatus of claim 8, wherein among the plurality of drain holes and the plurality of drain grooves, the number of drain holes and the drain grooves disposed in first sides of the chuck table and the film is different from the number of the drain holes and drain grooves disposed in second sides of the chuck table and the film.

12. The buffing cleaning apparatus of claim 7, wherein, in a plan view, the straight virtual bands of the plurality of drain holes and the plurality of drain grooves respectively extend lengthwise in two different horizontal directions.

13. The buffing cleaning apparatus of claim 3, wherein, in a plan view, the plurality of drain holes and the plurality of drain grooves pass through central portions of the chuck table and the film, and opposite ends of the plurality of drain holes and the plurality of drain grooves are open toward peripheral surfaces of the chuck table and the film.

14. The buffing cleaning apparatus of claim 13, wherein, in a plan view, some drain holes and some drain grooves and other drain holes and other drain grooves, among the plurality of drain holes and the plurality of drain grooves, are disposed to intersect each other.

15. The buffing cleaning apparatus of claim 3, wherein a region in which an extending direction of the zigzag shape changes has a round shape.

16. The buffing cleaning apparatus of claim 2, wherein, in a plan view, the plurality of drain holes and the plurality of drain grooves have circular shapes having different diameters from each other.

17. The buffing cleaning apparatus of claim 1, wherein, in a plan view, the drain hole and the drain groove have a circular portion disposed in central portions of the chuck table and the film, and a radial portion disposed radially from the circular portion.

18. The buffing cleaning apparatus of claim 1, wherein, in a plan view, the drain hole and the drain groove have circular portions having different diameters, and a radial portion disposed radially to intersect the circular portions.

19. The buffing cleaning apparatus of claim 1, further comprising:

a cleaning module disposed to be adjacent to the chuck table, the cleaning module configured to perform cleaning of the wafer.

20. A buffing cleaning apparatus comprising:

a chuck table having a vacuum hole;

a film disposed on an upper surface of the chuck table, the film having a communication hole vertically overlapping the vacuum hole; and a cleaning module disposed to be adjacent to the chuck table to perform cleaning of a wafer, wherein the film is configured to receive the wafer on an upper surface of the film, the film has a drain hole configured such that pure water remaining from a previous process flows through the drain hole, the chuck table has a drain groove vertically overlapping the drain hole, and at least one end of the drain hole is open toward a peripheral surface of the film, and at least one end of the drain groove is open toward a peripheral surface of the chuck table.

* * * * *